United States Patent
Wu et al.

(10) Patent No.: US 10,957,614 B2
(45) Date of Patent: Mar. 23, 2021

(54) HEAT DISSIPATION SUBSTRATE AND FABRICATING METHOD THEREOF

(71) Applicant: Subtron Technology Co., Ltd., Hsinchu County (TW)

(72) Inventors: Chien-Hung Wu, Hsinchu County (TW); Tzu-Shih Shen, Hsinchu County (TW)

(73) Assignee: Subtron Technology Co., Ltd., Hsinchu County (TW)

(*) Notice: Subject to any disclaimer, the term of this patent is extended or adjusted under 35 U.S.C. 154(b) by 0 days.

(21) Appl. No.: 16/586,913

(22) Filed: Sep. 28, 2019

(65) Prior Publication Data

US 2020/0303271 A1  Sep. 24, 2020

(30) Foreign Application Priority Data

Mar. 21, 2019  (TW) .................................. 108109876

(51) Int. Cl.
- *H01L 23/14* (2006.01)
- *H01L 23/373* (2006.01)
- *H01L 21/48* (2006.01)

(52) U.S. Cl.
CPC ........ *H01L 23/142* (2013.01); *H01L 21/4803* (2013.01); *H01L 21/4846* (2013.01); *H01L 23/3735* (2013.01); *H01L 21/4882* (2013.01)

(58) Field of Classification Search
CPC ............... H01L 23/142; H01L 23/3735; H01L 21/4803; H01L 21/4846; H01L 21/4882
See application file for complete search history.

(56) References Cited

U.S. PATENT DOCUMENTS

| 5,991,156 A | * | 11/1999 | Bond | .................. H01L 23/4334 361/707 |
| 6,376,908 B1 | * | 4/2002 | Gaku | ...................... H01L 23/13 257/707 |

(Continued)

FOREIGN PATENT DOCUMENTS

| TW | 401723 | 8/2000 |
| TW | 201013863 | 4/2010 |

(Continued)

OTHER PUBLICATIONS

"Office Action of Taiwan Counterpart Application," dated Nov. 4, 2019, p. 1-p. 6.

*Primary Examiner* — Peniel M Gumedzoe
(74) *Attorney, Agent, or Firm* — JCIPRNET (57) ABSTRACT

A heat dissipation substrate includes an insulating layer, a metal heat dissipation block, and a patterned structure layer. The insulating layer has a first surface, a second surface and at least one through hole. The metal heat dissipation block passes through the insulating layer from the second surface of the insulating layer and has an upper surface, a lower surface, and a contact surface. There is a first vertical height between the contact surface and the lower surface. The patterned structure layer includes a patterned circuit layer and at least one conductive structure layer. The patterned circuit layer is disposed on the first surface of the insulating layer, and the conductive structure layer is connected to the patterned circuit layer and extends to cover an inner wall of the through hole. The patterned circuit layer has a top surface, the conductive structure layer has a bottom surface. There is a second vertical height between the top surface and the first surface, and the first vertical height is 3 times to 300 times the second vertical height.

6 Claims, 6 Drawing Sheets

(56) References Cited

U.S. PATENT DOCUMENTS

| | | | | |
|---|---|---|---|---|
| 7,741,158 B2* | 6/2010 | Leung | ................ | H01L 23/13 |
| | | | | 438/122 |
| 8,310,044 B2* | 11/2012 | Takahashi | ............ | H01L 23/367 |
| | | | | 257/712 |
| 2001/0013425 A1* | 8/2001 | Rokugawa | ............ | H05K 1/113 |
| | | | | 174/262 |
| 2013/0256854 A1* | 10/2013 | Kobayashi | ........ | H01L 23/49861 |
| | | | | 257/675 |
| 2015/0369467 A1 | 12/2015 | Saito et al. | | |

FOREIGN PATENT DOCUMENTS

| | | |
|---|---|---|
| TW | 201236228 | 9/2012 |
| TW | 201712766 | 4/2017 |

* cited by examiner

HEAT DISSIPATION SUBSTRATE AND FABRICATING METHOD THEREOF

CROSS-REFERENCE TO RELATED APPLICATION

This application claims the priority benefit of Taiwan application serial no. 108109876, filed on Mar. 21, 2019. The entirety of the above-mentioned patent application is hereby incorporated by reference herein and made a part of this specification.

BACKGROUND

Field of the Disclosure

The present disclosure relates to a substrate structure and a method of fabricating the same, and more particularly to a heat dissipation substrate and a fabricating method thereof.

Description of Related Art

The heat dissipation substrate is mainly composed of a metal substrate and a plurality of patterned conductive layers on the metal substrate and at least one insulating layer, wherein the insulating layer is disposed between two adjacent patterned conductive layers. Generally, a heat generating component is fixed to the heat dissipation substrate through an adhesive layer, and the heat generated by the heat generating component can be transmitted to the metal substrate through the adhesive layer, the patterned conductive layer, and the insulating layer for heat dissipation. However, since the thermal conductivity of the adhesive layer and the insulating layer is inferior, when the heat generated by the heat generating component is transmitted to the metal substrate through the adhesive layer or the insulating layer, thermal resistance is increased, which in turn causes it difficult to dissipate heat. Therefore, how to make the heat generated by the heat generating component to be more efficiently transmitted to the outside has become one of the topics that designers pay attention to in research and development.

SUMMARY

The disclosure provides a heat dissipation substrate with better heat dissipation effect.

The disclosure also provides a method for fabricating a heat dissipation substrate for fabricating the above heat dissipation substrate.

The heat dissipation substrate of the present disclosure includes an insulating layer, a metal heat dissipation block and a patterned structure layer. The insulating layer has a first surface and a second surface opposite to each other and at least one through hole penetrating through the insulating layer and connects the first surface and the second surface. The metal heat dissipation block passes through the insulating layer from the second surface of the insulating layer, and has an upper surface, a lower surface, and a contact surface. The contact surface is disposed between the upper surface and the lower surface and contacts the second surface. There is a first vertical height between the contact surface and the lower surface. The patterned structure layer includes a patterned circuit layer and at least one conductive structure layer. The patterned circuit layer is disposed on the first surface of the insulating layer, and the conductive structure layer is connected to the patterned circuit layer and extends to cover the inner wall of the through hole. The patterned circuit layer has a top surface that is relatively far from the conductive structure layer, and the conductive structure layer has a bottom surface that is relatively far from the patterned circuit layer. The bottom surface is aligned with the second surface, and there is a second vertical height between the top surface and the first surface, and the first vertical height is 3 times to 300 times the second vertical height.

In an embodiment of the disclosure, the heat dissipation substrate further includes a seed layer disposed on the first surface of the insulating layer and located between the patterned circuit layer and the insulating layer.

In an embodiment of the disclosure, the heat dissipation substrate further includes a solder resist layer disposed on the first surface of the insulating layer and covering a portion of the patterned circuit layer.

In an embodiment of the disclosure, the conductive structure layer fills the through hole.

In an embodiment of the disclosure, the width of the metal heat dissipation block is gradually decreased from the contact surface to the upper surface in a cross-sectional view.

A method of fabricating a heat dissipation substrate of the present disclosure includes the following steps. A metal block formed with a plurality of recesses is provided. An insulating layer is formed in the recess, wherein the insulating layer has a first surface and a second surface opposite to each other, and the second surface contacts the metal block, and the insulating layer exposes an upper surface of the metal block. At least one through hole penetrating through the metal block and the insulating layer is formed. A patterned structure layer is formed in the first surface of the insulating layer and the through hole. The patterned structure layer includes a patterned circuit layer and at least one conductive structure layer. The patterned circuit layer is disposed on the first surface of the insulating layer, and the conductive structure layer is connected to the patterned circuit layer and extends to cover the inner wall of the through hole. An etching process is performed to remove at least a portion of the metal block to expose the second surface of the insulating layer and form a metal heat dissipation block. The metal heat dissipation block has an upper surface, a lower surface, and a contact surface, wherein the contact surface contacts the second surface and is disposed between the upper surface and the lower surface, and there is a first vertical height between the contact surface and the lower surface. The patterned circuit layer has a top surface that is relatively far from the conductive structure layer, and the conductive structure layer has a bottom surface that is relatively far from the patterned circuit layer. The bottom surface is aligned with the second surface, and there is a second vertical height between the top surface and the first surface, and the first vertical height is 3 times to 300 times the second vertical height.

In an embodiment of the disclosure, after forming the insulating layer in the recess, and before forming the through hole penetrating through the metal block and the insulating layer, the method further includes: forming a seed layer on the first surface of the insulating layer.

In an embodiment of the disclosure, the step of forming the patterned structure layer includes forming the metal layer by using the seed layer as a conductive path. The metal layer completely covers the seed layer, the upper surface of the metal block, and the through hole, wherein the metal layer completely fills the through hole. A portion of the metal layer is patterned to form a patterned circuit layer that exposes a portion of the first surface of the insulating layer.

In an embodiment of the disclosure, after the forming the patterned structure layer in the first surface of the insulating layer and the through hole, and before performing the etching process, the method further includes: forming a solder resist layer on the first surface of the insulating layer to cover a portion of the patterned circuit layer.

In an embodiment of the disclosure, when the etching process is performed, a portion of the patterned structure layer is simultaneously removed to form at least one via hole.

Based on the above, in the design of the heat dissipation substrate of the present disclosure, there is a first vertical height between the contact surface and the lower surface of the metal heat dissipation block, and there is a second vertical height between the top surface of the patterned circuit layer and the first surface of the insulating layer, and the first vertical height is 3 times to 300 times the second vertical height. The design can improve the heat dissipation efficiency of the heat dissipation substrate and achieve the effect of rapid heat dissipation.

In order to make the aforementioned features and advantages of the disclosure more comprehensible, embodiments accompanying figures are described in detail below.

DESCRIPTION OF EMBODIMENTS

Figure 1A:
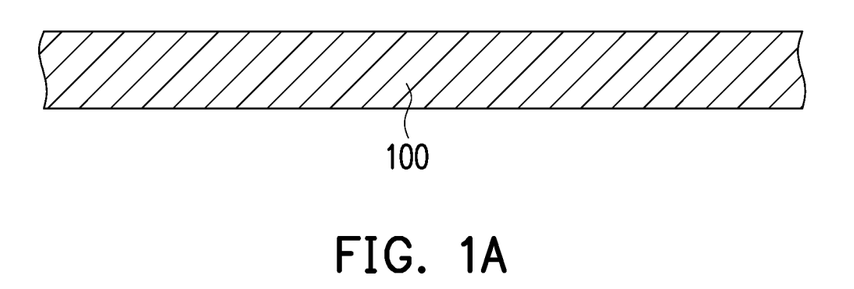
FIG. 1A to FIG. 1I are schematic cross-sectional views showing a method of fabricating a heat dissipation substrate according to an embodiment of the disclosure.

FIG. 1A to FIG. 1I are schematic cross-sectional views showing a method of fabricating a heat dissipation substrate according to an embodiment of the disclosure. Referring to FIG. 1A, a metal substrate 100 is provided, wherein the metal substrate 100 has good thermal conductivity, such as a thick copper plate, but the disclosure is not limited thereto.

Figure 1B:
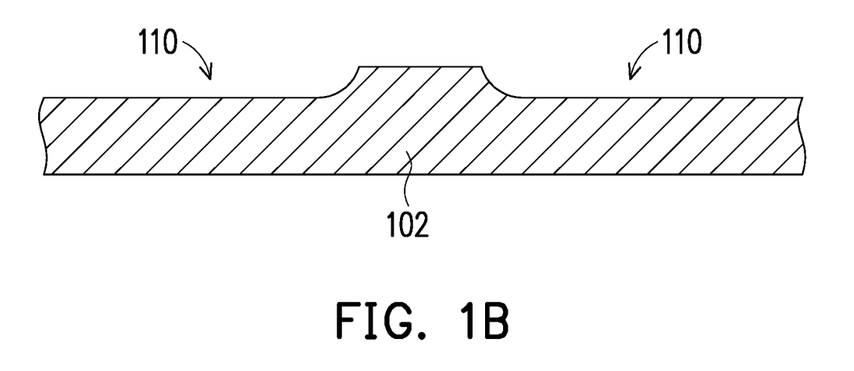

Next, referring to FIG. 1A and FIG. 1B, the metal substrate 100 is subjected to a removal process to form a metal block 102 having a plurality of recesses 110. Herein, the depth of the recess 110 is, for example, half the thickness of the metal substrate 100, and the removing process is, for example, an etching process, but the disclosure is not limited thereto. At this point, providing the metal block 102 with the recess 110 has been completed.

Figure 1C:
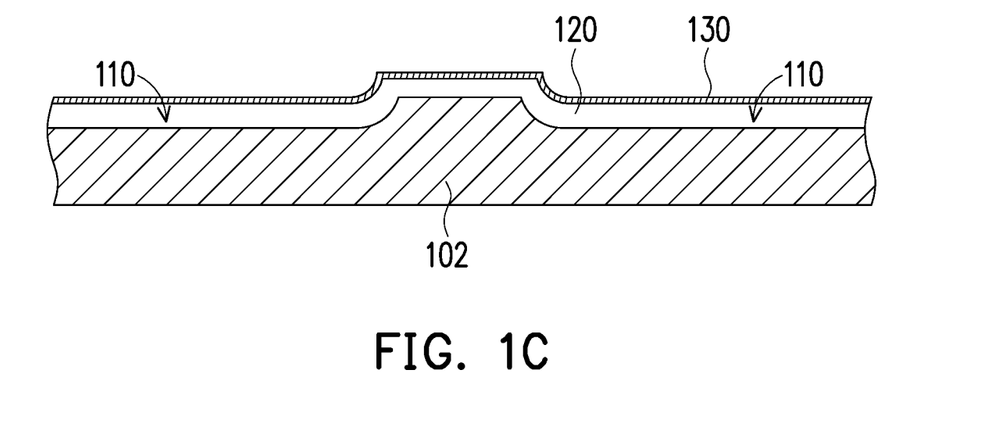

Next, referring to FIG. 1C, an insulating material layer 120 is formed in the recess 110 of the metal block 102. The material of the insulating material layer 120 is, for example, resin, a prepreg or polypropylene (PP), the disclosure provides no limitation thereto.

As shown in FIG. 1C, in the embodiment, when the insulating material layer 120 is formed, the seed material layer 130 may be simultaneously formed on the insulating material layer 120. In an embodiment, the seed material layer 130 may be attached to the insulating material layer 120 first, and then the insulating material layer 120 and the seed material layer 130 thereon may be attached to the metal block 102 together. On this occasion, since the metal block 102 has the recess 110, that is, an uneven surface is formed, the insulating material layer 120 and the seed material layer 130 thereon may be conformally disposed on the metal block 102. Herein, the material of the seed material layer 130 is, for example, a copper foil, but the disclosure is not limited thereto.

Figure 1D:
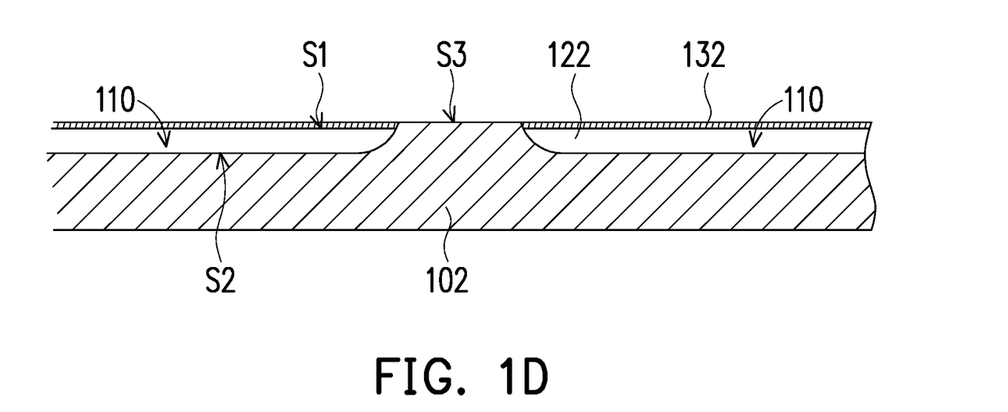

Next, referring to FIG. 1D, a grinding process is performed to remove a portion of the seed material layer 130 and a portion of the insulating material layer 120 to form an insulating layer 122 and a seed layer 132 thereon, and expose an upper surface S3 of the metal block 102. Specifically, the insulating layer 122 has the first surface S1 and the second surface S2 opposed to each other. The seed layer 132 is disposed on the first surface S1 of the insulating layer 122, and the second surface S2 of the insulating layer 122 contacts the metal block 102. The insulating layer 122 and the seed layer 132 expose the upper surface S3 of the metal block 102.

Figure 1E:
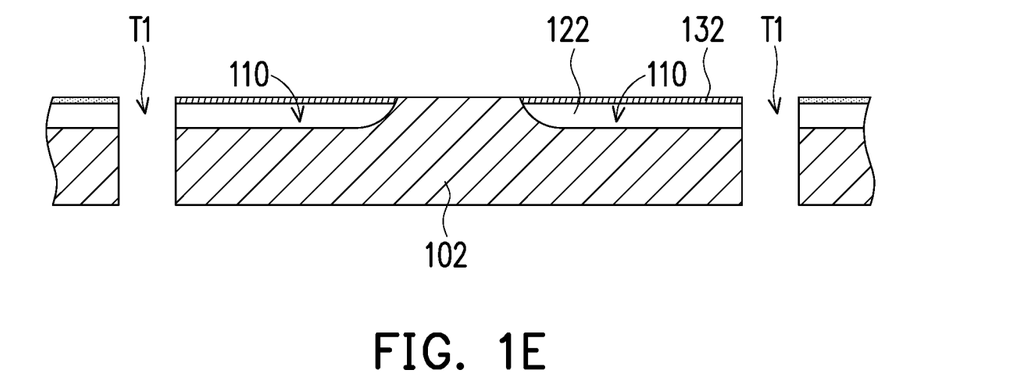

Next, referring to FIG. 1E, at least one through hole T1 (two are shown schematically) penetrating through the metal block 102 and the insulating layer 122 is formed. Herein, the through hole T1 is formed at the recess 110 of the metal block 102, and the through hole T1 also penetrates through the seed layer 132. In the present embodiment, the through hole T1 is formed by the means of, for example, laser drilling or mechanical drilling, but the disclosure is not limited thereto.

Figure 1F:
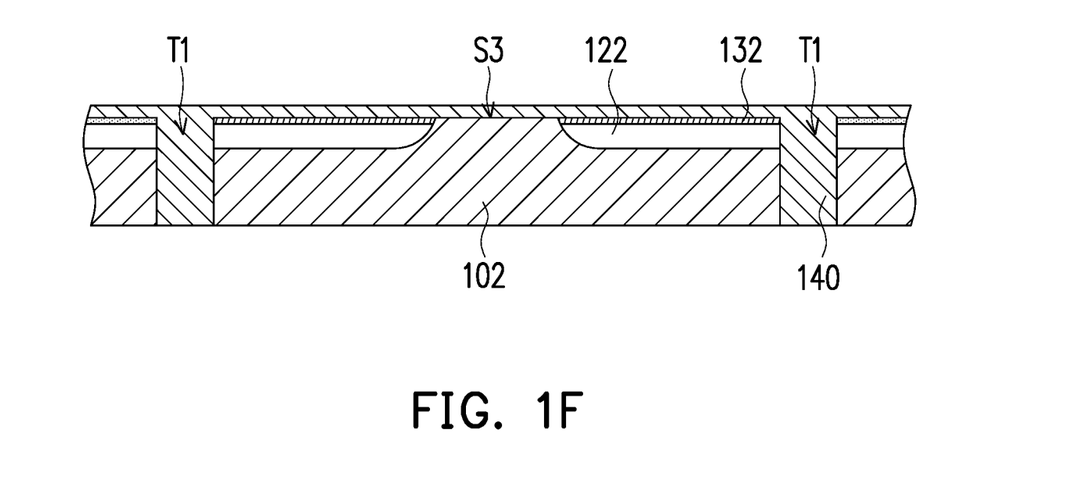

Next, referring to FIG. 1F, the metal layer 140 is formed by using the seed layer 132 as a conductive path, wherein the metal layer 140 completely covers the seed layer 132, the upper surface S3 of the metal block 102, and the through hole T1. Herein, the material of the metal layer 140 is, for example, copper, but the disclosure is not limited thereto.

Figure 1G:
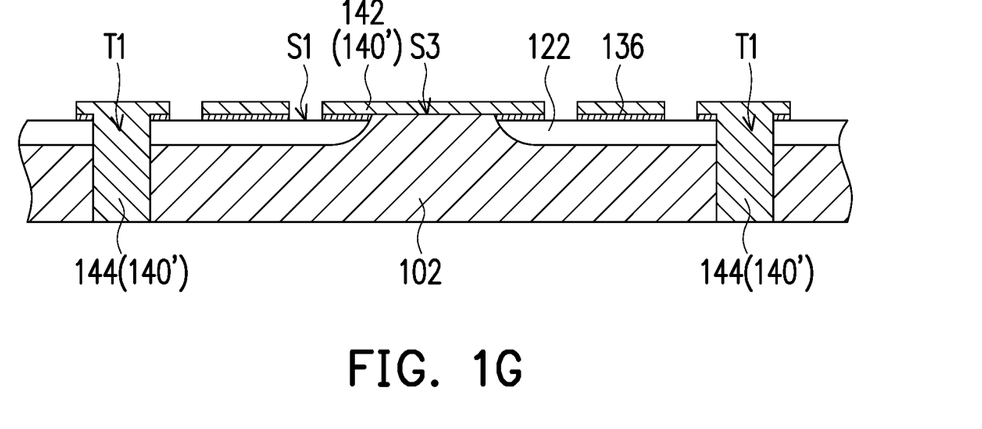

Next, referring to FIG. 1F and FIG. 1G, a portion of the metal layer 140 and the seed layer 132 underneath are patterned to form a patterned circuit layer 142 exposing a portion of the first surface S1 of the insulating layer 122. On this occasion, the patterned seed layer 136 is disposed between the patterned circuit layer 142 and the first surface S1 of the insulating layer 122, and the metal layer 140 completely fills the through hole T1, thereby defining the conductive structure layer 144. At this point, the patterned structure layer 140' has been formed in the first surface S1 of the insulating layer 122 and the through hole T1. The patterned structure layer 140' includes a patterned circuit layer 142 and at least one conductive structure layer 144 (two are shown schematically). The patterned circuit layer 142 is disposed on the first surface S1 of the insulating layer 122, and the conductive structure layer 144 is connected to the patterned circuit layer 142 and extends to cover the inner wall of the through hole T1.

Figure 1H:
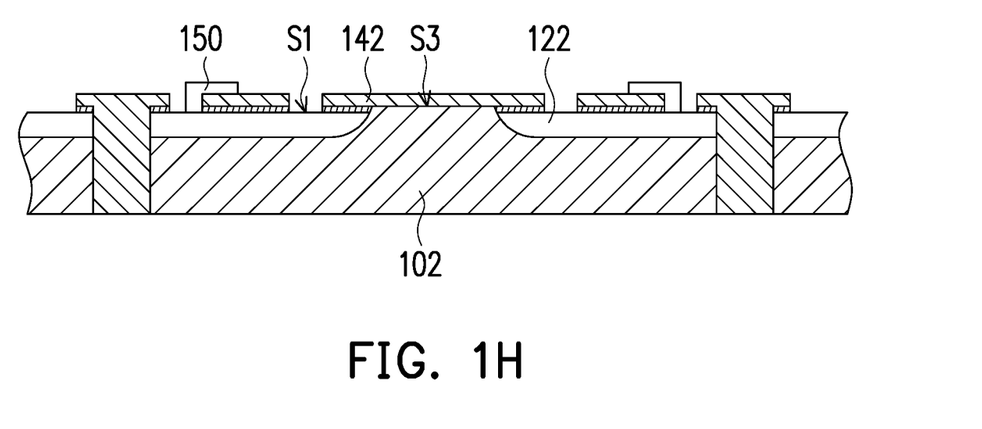

Thereafter, referring to FIG. 1H, a solder resist layer 150 is formed on the first surface S1 of the insulating layer 122 and covers a portion of the patterned circuit layer 142.

Figure 1I:
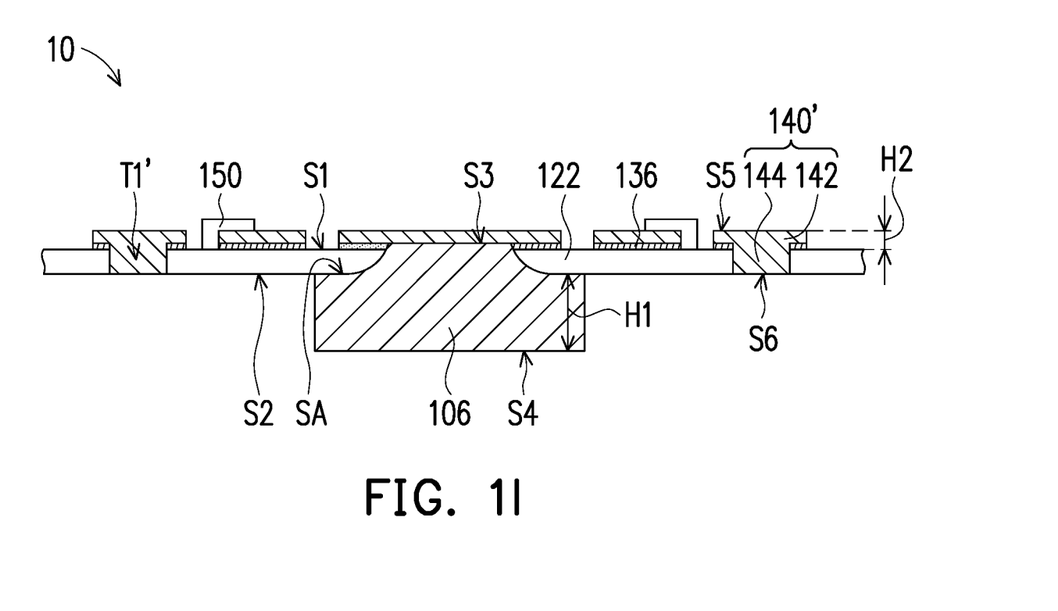

Finally, referring to FIG. 1H and FIG. 1I, an etching process is performed to remove at least a portion of the metal block 102 to expose the second surface S2 of the insulating layer 122 and form the metal heat dissipation block 106. Herein, the metal heat dissipation block 106 has an upper surface S3, a lower surface S4, and a contact surface SA. The contact surface SA contacts the second surface S2 of the insulating layer 122 and is disposed between the upper surface S3 and the lower surface S4. There is a first vertical height H1 between the contact surface SA and the lower surface S4. The patterned circuit layer 142 has a top surface S5 that is relatively far from the conductive structure layer 144, and the conductive structure layer 144 has a bottom surface S6 that is relatively far from the patterned circuit layer 142. The bottom surface S6 of the conductive structure layer 144 is substantially aligned with the second surface S2 of the insulating layer 122, and there is a second vertical height H2 between the top surface S5 and the first surface S1. Preferably, the first vertical height H1 is 3 times to 300 times the second vertical height H2. At this point, the fabrication of the heat dissipation substrate 10 has been completed.

Structurally, referring again to FIG. 1I, in the present embodiment, the heat dissipation substrate 10 includes an insulating layer 122, a metal heat dissipation block 106, and a patterned structure layer 140'. The insulating layer 122 has a first surface S1 and a second surface S2 opposite to each other and a through hole T1' that penetrates through the insulating layer 122 and connects the first surface S1 and the second surface S2. The metal heat dissipation block 106 passes through the insulating layer 122 from the second surface S2 of the insulating layer 122, and has an upper surface S3, a lower surface S4, and a contact surface SA. The contact surface S4 is disposed between the upper surface S3 and the lower surface S4 and contacts the second surface S2, and there is a first vertical height H1 between the contact surface SA and the lower surface S4. The patterned structure layer 140' includes the patterned circuit layer 142 and the conductive structure layer 144. The patterned circuit layer 142 is disposed on the first surface S1 of the insulating layer 122, and the conductive structure layer 144 is connected to the patterned circuit layer 142 and extends to cover the inner wall of the through hole T1'. The patterned circuit layer 142 has the top surface S5 that is relatively far from the conductive structure layer 144, and the conductive structure layer 144 has the bottom surface S6 that is relatively far from the patterned circuit layer 142. The bottom surface S6 is aligned with the second surface S2, and there is a second vertical height H2 between the top surface S5 and the first surface S1, and the first vertical height H1 is 3 times to 300 times the second vertical height H2.

Moreover, in the present embodiment, the heat dissipation substrate 10 may further include a seed layer 136 disposed on the first surface S1 of the insulating layer 122 and disposed between the patterned circuit layer 142 and the insulating layer 122. In addition, the heat dissipation substrate 10 of the present embodiment may further include a solder resist layer 150, wherein the solder resist layer 150 is disposed on the first surface S1 of the insulating layer 122 and covers a portion of the patterned circuit layer 142. As shown in FIG. 1I, the heat dissipation substrate 10 of the present embodiment is implemented as a single-sided circuit board. The conductive structure layer 144 fills the through hole T1', and viewing from a cross-sectional view, the width of the metal heat dissipation block 106 is gradually decreased from the contact surface SA to the upper surface S3.

In the design of the heat dissipation substrate 10 of the present embodiment, there is a first vertical height H1 between the contact surface SA and the lower surface S4 of the metal heat dissipation block 106, and there is a second vertical height H2 between the top surface S5 of the patterned circuit layer 142 and the first surface S1 of the insulating layer 122, and the first vertical height H1 is 3 times to 300 times the second vertical height H2. That is, the thickness of the metal heat dissipation block 106 is greater than the thickness of the patterned structure layer 140' above the first surface S1 of the insulating layer 122. With this design, the heat dissipation efficiency of the heat dissipation substrate 10 can be improved, thereby achieving the effect of rapid heat dissipation.

It should be noted that the following embodiments adopt the same reference numerals and parts of the above-mentioned embodiments, and the same reference numerals are used to refer to the same or similar elements, and the description of the same technical content is omitted. For the description of the omitted portions, reference may be made to the foregoing embodiments, and no repetition is not incorporated in the following embodiments.

Figure 2:
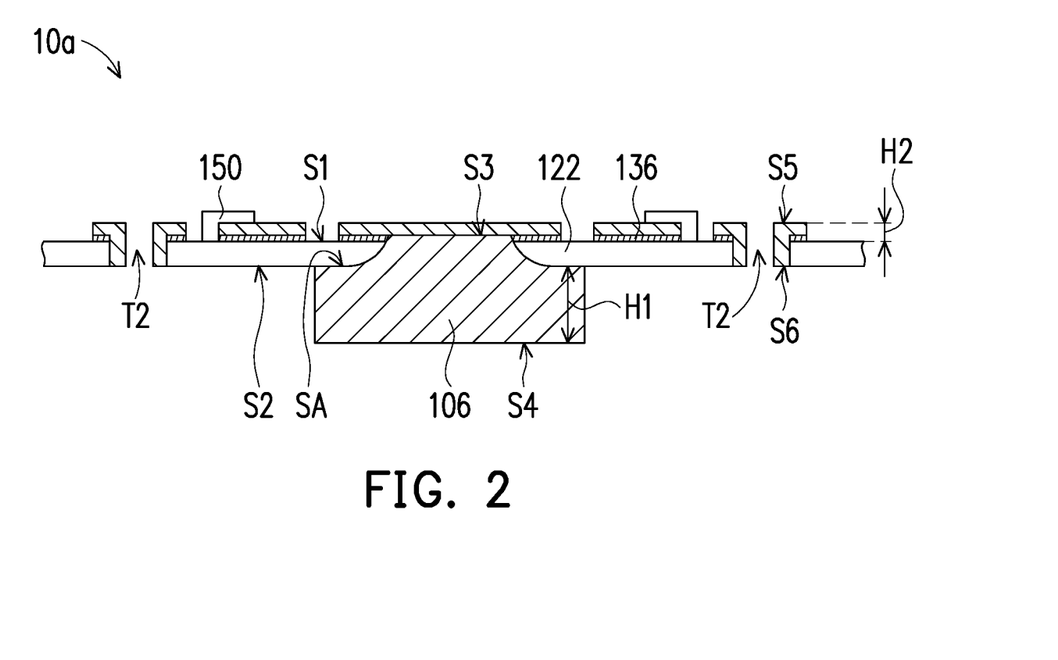
FIG. 2 is a schematic cross-sectional view of a heat dissipation substrate according to another embodiment of the present disclosure.

FIG. 2 is a schematic cross-sectional view of a heat dissipation substrate according to another embodiment of the present disclosure. Referring to FIG. 1I and FIG. 2, a heat dissipation substrate 10a of the present embodiment is similar to the heat dissipation substrate 10 of FIG. 1I. The difference between the two is that, when the heat dissipation substrate 10a of the present embodiment is subjected to the etching process, a part of the patterned structure layer 140' is removed simultaneously, thereby forming at least one via hole T2 (two are shown schematically).

Figure 3:
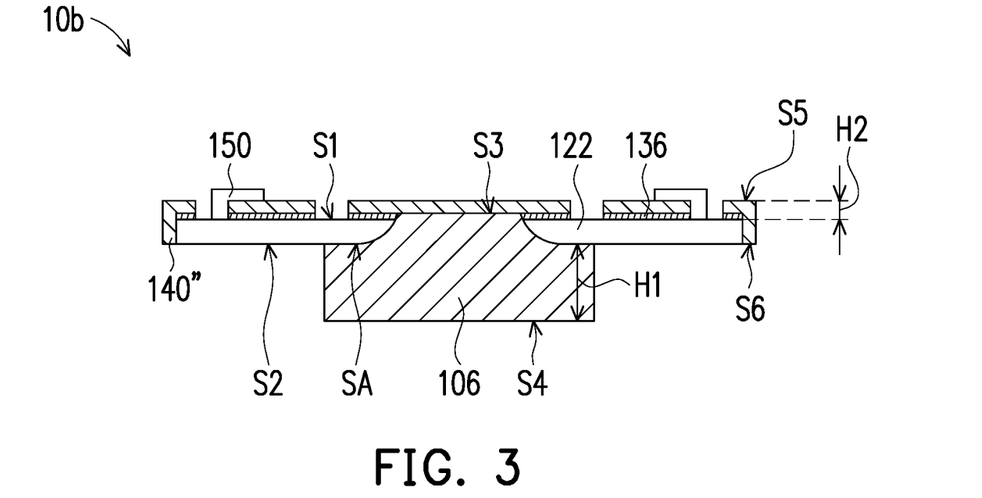
FIG. 3 is a schematic cross-sectional view of a heat dissipation substrate according to another embodiment of the present disclosure.

FIG. 3 is a schematic cross-sectional view of a heat dissipation substrate according to another embodiment of the present disclosure. Referring to FIG. 2 and FIG. 3, a heat dissipation substrate 10b of the present embodiment is similar to the heat dissipation substrate 10a of FIG. 2, and the difference between the two is that, after the heat dissipation substrate 10b of the present embodiment is subjected to the etching process, a part of the patterned structure layer 140' (please refer to FIG. 1I) and a part of the insulating layer 122 are removed, such that the periphery of the heat dissipation substrate 10b is covered by the patterned structure layer 140".

Figure 4:
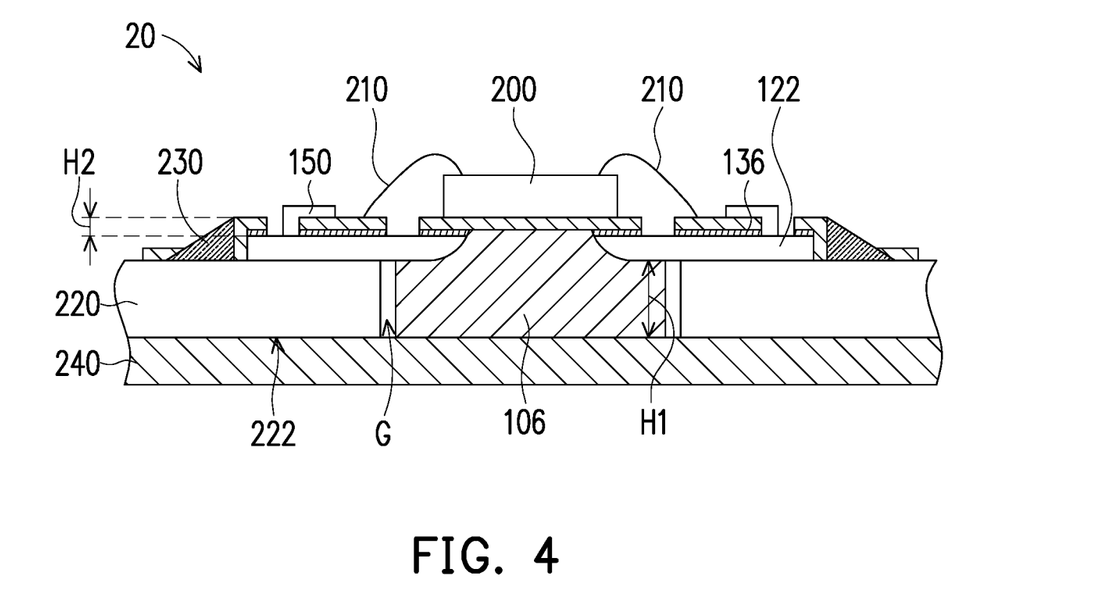
FIG. 4 is a schematic cross-sectional view showing a heat generating component disposed on the heat dissipation substrate of FIG. 3.

Furthermore, in the application of the heat dissipation substrate 10b of the present embodiment, please refer to FIG. 3 and FIG. 4, a heat generating component 200 can be disposed on the heat dissipation substrate 10b to form a package structure 20. Specifically, in the embodiment, the heat generating component 200 can be electrically connected to the patterned structure layer 140" through a wire 210, and the heat generated by the heat generating component 200 can be directly transmitted to the outside through the patterned structure layer 140" and the metal heat dissipation block 106 in sequence directly. That is, the heat generating component 200 can have the shortest heat dissipation path on the heat dissipation substrate 10b. Moreover, since the thickness of the metal heat dissipation block 106 is greater than the thickness of the patterned structure layer 140" above the first surface S1 of the insulating layer 122, the heat dissipation efficiency of the heat dissipation substrate 10b can be improved, thereby achieving the effect of rapid heat dissipation.

Moreover, the heat dissipation substrate 10b may be electrically connected to an external circuit 220 through a conductive paste 230. The external circuit 220 is, for example, a main board, but the disclosure is not limited thereto. In addition, the heat dissipation substrate 10b of the embodiment may also be disposed on a heat dissipation block 240 to increase the heat dissipation effect. Herein, the metal heat dissipation block 106 of the heat dissipation substrate 10b and the external circuit 220 are directly disposed on the heat dissipation block 240, wherein there is a gap G between the external circuit 220 and the metal heat dissipation block 106. As shown in FIG. 4, the heat generated by the heat generating component 200 not only can be directly transmitted to the outside through the patterned structure layer 140", the metal heat dissipation block 106, and the heat dissipation block 240 in sequence, but also can be transmitted to the outside through the patterned structure layer 140", the external circuit 220 and the heat dissipation block 240 in sequence, thereby achieving a better heat dissipation effect.

In summary, in the design of the heat dissipation substrate of the present disclosure, there is a first vertical height between the contact surface and the lower surface of the metal heat dissipation block, and there is a second vertical height between the top surface of the patterned circuit layer and the first surface of the insulating layer, and the first vertical height is 3 times to 300 times the second vertical height. The above design can improve the heat dissipation efficiency of the heat dissipation substrate and achieve the effect of rapid heat dissipation. In addition, when the heat generating component is subsequently disposed on the heat dissipation substrate of the present disclosure, the heat generated by the heat generating component can be rapidly transmitted to the outside through the patterned circuit layer and the metal heat dissipation block in sequence, and the heat dissipating effect can be better.

Although the disclosure has been disclosed by the above embodiments, the embodiments are not intended to limit the disclosure. It will be apparent to those skilled in the art that various modifications and variations can be made to the structure of the disclosure without departing from the scope or spirit of the disclosure. Therefore, the protecting range of the disclosure falls in the appended claims.

What is claimed is:

1. A method for fabricating a heat dissipation substrate, comprising:
   providing a metal block formed with a plurality of recesses;
   forming an insulating layer in the recesses, the insulating layer has a first surface and a second surface opposite to each other, the second surface contacts the metal block, and the insulating layer exposes an upper surface of the metal block;
   forming at least one through hole penetrating through the metal block and the insulating layer;
   forming a patterned structure layer on the first surface of the insulating layer and in the through hole, the patterned structure layer comprising a patterned circuit layer and at least one conductive structure layer, wherein the patterned circuit layer is disposed on the first surface of the insulating layer, and the conductive structure layer is connected to the patterned circuit layer and extends to cover an inner wall of the through hole; and
   performing an etching process to remove at least a portion of the metal block to expose the second surface of the insulating layer and form a metal heat dissipation block, the metal heat dissipation block having the upper surface, a lower surface and a contact surface, wherein the contact surface contacts the second surface and is disposed between the upper surface and the lower surface, and there is a first vertical height between the contact surface and the lower surface, the patterned circuit layer has a top surface away from the conductive structure layer, and the conductive structure layer has a bottom surface away from the patterned circuit layer, the bottom surface is aligned with the second surface, there is a second vertical height between the top surface and the first surface, and the first vertical height is 3 times to 300 times the second vertical height.

2. The method for fabricating the heat dissipation substrate according to claim 1, wherein after forming the insulating layer in the recesses, and before forming the through hole penetrating through the metal block and the insulating layer, the method further comprising:
   forming a seed layer on the first surface of the insulating layer.

3. The method for fabricating the heat dissipation substrate according to claim 2, wherein the step of forming the patterned structure layer comprises:
   forming a metal layer by using the seed layer as a conductive path, the metal layer completely covering the seed layer, the upper surface of the metal block, and the through hole, wherein the metal layer completely fills the through hole; and
   patterning a portion of the metal layer to form the patterned circuit layer exposing a portion of the first surface of the insulating layer.

4. The method for fabricating the heat dissipation substrate according to claim 1, wherein after forming the patterned structure layer on the first surface of the insulating layer and in the through hole, and before performing the etching process, the method further comprising:
   forming a solder resist layer on the first surface of the insulating layer and covering a portion of the patterned circuit layer.

5. The method for fabricating the heat dissipation substrate according to claim 1, wherein when the etching process is performed, a portion of the patterned structure layer is simultaneously removed to form at least one via hole.

6. The method for fabricating the heat dissipation substrate according to claim 1, wherein, in a cross-sectional view, a width of the metal heat dissipation block is gradually decreased from the contact surface to the upper surface.

* * * * *